United States Patent
Kikugawa et al.

(10) Patent No.: US 7,446,685 B1
(45) Date of Patent: Nov. 4, 2008

(54) READ SIGNAL PROCESSING CIRCUIT, READ SIGNAL PROCESSING METHOD, AND OPTICAL DISC DRIVE

(75) Inventors: Atsushi Kikugawa, Tokyo (JP); Takahiro Kurokawa, Fujisawa (JP)

(73) Assignees: Hitachi, Ltd., Tokyo (JP); Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 11/828,381

(22) Filed: Jul. 26, 2007

(30) Foreign Application Priority Data

May 14, 2007 (JP) .............................. 2007-127673

(51) Int. Cl.
*H03M 1/00* (2006.01)

(52) U.S. Cl. .................. 341/142; 341/118; 341/139; 360/46; 360/51; 369/59.19; 369/59.21; 375/341; 375/376

(58) Field of Classification Search ........... 341/139, 341/142
See application file for complete search history.

(56) References Cited

U.S. PATENT DOCUMENTS

| | | | | |
|---|---|---|---|---|
| 6,721,256 | B2 * | 4/2004 | Fukuda et al. | 369/59.22 |
| 6,809,997 | B2 * | 10/2004 | Park et al. | 369/47.1 |
| 6,873,668 | B2 * | 3/2005 | Yamamoto et al. | 375/373 |
| 6,876,616 | B2 * | 4/2005 | Tonami | 369/59.17 |
| 7,224,659 | B2 * | 5/2007 | Wada | 369/53.35 |
| 2005/0180287 | A1 * | 8/2005 | Lee et al. | 369/59.15 |
| 2006/0203949 | A1 | 9/2006 | Minemura | |
| 2006/0280240 | A1 | 12/2006 | Kikugawa | |

FOREIGN PATENT DOCUMENTS

| | | |
|---|---|---|
| JP | 11-296987 | 10/1999 |
| JP | 2003-030850 | 1/2003 |
| JP | 20033-030850 | 1/2003 |
| JP | 2006-127559 | 5/2005 |
| JP | 2006-004465 | 1/2006 |
| JP | 2006-252681 | 9/2006 |
| JP | 2006-344294 | 12/2006 |

OTHER PUBLICATIONS

U.S. Appl. No. 11/488,625, filed Jul. 19, 2006, Atsushi Kikugawa, et al.
U.S. Appl. No. 11/704,964, filed Feb. 12, 2007, Atsushi Kikugawa, et al.

* cited by examiner

*Primary Examiner*—Khai M Nguyen
(74) *Attorney, Agent, or Firm*—Antonelli, Terry, Stout & Kraus, LLP.

(57) ABSTRACT

The present invention provides a read channel and a drive capable of suppressing deterioration in performance of a PLL and a Viterbi decoder by using a DC component eliminating means capable of higher-speed operation than hitherto. The location of an edge is determined by using differential of a read signal, and a DC component is detected from the midpoint level of the edge. Detection of a pseudo-edge due to a long mark or space signal is prevented by limiting the absolute value of a maximum or minimum of a differential coefficient when the location of the edge is determined from the differential coefficient of the read signal. Internal operation of a DC component detector is controlled according to the state of the PLL and the magnitude of the DC component.

16 Claims, 11 Drawing Sheets

Conventional channel

DC compensated channel

READ SIGNAL PROCESSING CIRCUIT, READ SIGNAL PROCESSING METHOD, AND OPTICAL DISC DRIVE

CLAIM OF PRIORITY

The present application claims priority from Japanese application JP 2007-127673 filed on May 14, 2007, the content of which is hereby incorporated by reference into this application.

BACKGROUND OF THE INVENTION

1. Field of the Invention

The present invention relates to a read channel for an optical disc drive, a magnetic hard disc drive, or the like.

2. Description of the Related Art

One noteworthy feature of optical disc drive units and discs in conformity with DVD (digital versatile disc), Blu-ray Disc (hereinafter referred to simply as "BD") and other standards is that recording media are interchangeable and thus the discs are interchangeable among different models for writing and reading. However, situations can, in actuality, possibly arise where reading is extremely difficult due to the discs becoming damaged or soiled on their information-bearing surfaces. Although the scope of application of the present invention is not limited to a BD, description will hereinafter be given assuming that the present invention is applied to the BD. Likewise, terms as employed herein are basically those used for the BD.

FIG. 2 shows an example of the configuration of a read channel in a very basic form. A read signal processing system that leads an analog read signal through decoding to a bit stream, including an analog equalizer and a PLL (phase locked loop), is herein called "read channel." The read signal processing system is herein assumed as a Viterbi decoding system that performs AD (analog-to-digital) conversion on the analog read signal and then performs signal processing on the signal. Accordingly, the term "read signal" is herein employed almost exclusively for a digital signal after the AD conversion. However, both the analog and digital signals, if apparent in context, are called merely "read signal" for the sake of simplicity, because those skilled in the art are unlikely to confuse between the analog signal before the AD conversion and the digital signal.

An analog read signal is equalized by an analog equalizer 1 and is then converted into a digital signal by an AD converter 2. At this point, the timing of sampling is determined by the channel clock.

After that, the signal is phase compared with the channel clock by a phase comparator 6. A phase error signal is smoothed through a loop filter 9 and is converted through a DA converter 11 into an analog signal, which is then inputted as a control voltage signal to a VCO (voltage controlled oscillator) 10. The VCO oscillates at the frequency indicated by the input voltage signal, and the oscillation frequency is used as the channel clock. In other words, the oscillation frequency is used as a drive clock for each element such as the AD converter, the phase comparator, the loop filter, the DA converter, and the Viterbi decoder 7. Since the fact that this closed loop forms a PLL and acts to bring the channel clock into synchronization with the clock of the read signal, and the details of operation thereof are well known in the art, detailed description thereof is not given. Also as for the Viterbi decoder, detailed description thereof is not given herein because the details of operation thereof do not have a direct relation to the present invention.

FIG. 3 is an illustration of assistance in explaining the principle of phase comparison. The phase are compared using edges (points where read signal cross the zero level), that is, points corresponding to boundaries between marks and spaces. The channel clock is in synchronization with the edges. The timing of AD conversion is shifted T/2 from clock timing referred to the edge (where T denotes a channel clock cycle). The read signal subjected to sampling after a lapse of T/2 from channel clock time nT will hereinafter be expressed as x(n) for the sake of simplicity (where n denotes an integer). In FIG. 3, the edge and sample points are shown by a dashed line and open (or white) circles, respectively, in an instance where the phase of the channel clock is in perfect synchronization with that of the edge. The edge lies at the time nT. At this time, the values of two sample points with the edge in between are defined as x(n−1) and x(n), respectively. The read signal is assumed to be in linear form in the vicinity of the edge. At this time, the relation between the values is as follows: x(n)=−x(n−1). In FIG. 3, the edge and sample points are shown by a solid line and solidly shaded (or black) circles, respectively, in an instance where the phase of the same edge lags ΔT behind that of the channel clock. The edge is assumed to lie between the channel clock times (n−1)T and nT, and the values of the sample points at the times (n−1)T and nT are defined as x(n−1) and x(n), respectively. Clearly, the relation between the values is as follows: x(n)≠−x(n−1). Obviously, assuming that the edge has linearity leads to Expression (1).

$$\Delta T \propto x(n) - x(n-1) \tag{1}$$

In other words, detection of phase error can be accomplished by sampling the read signal by the channel clock and distinguish the edges, then the phase error can be determined from the difference in read signal levels between the two points with the edge in between.

When the phase error is determined from the signal level in the manner as mentioned above, the phase error cannot be accurately determined if an unwanted DC (direct current) component is superimposed on the read signal. Such a situation will be described with reference to FIG. 4. In FIG. 4, the edge and the sample points are shown by a dashed line and open (or white) circles, respectively, in an instance where the unwanted DC component is absent and the phase of the read signal is in perfect synchronization with that of the channel clock. The edge and the sample points are shown by a solid line and solidly shaded (or black) circles, respectively, in an instance where the phase of the read signal is in synchronization with that of the channel clock and the DC component is superimposed by Δx on the read signal. Even if the read signal is in synchronization with the channel clock, the superimposed DC component causes the phase comparison based on definition by Expression (1) to output an erroneous phase error value. For this reason, the DC component of the read signal is removed by use of a high-pass filter before entering the phase comparator. Even under this condition, however, a pattern-dependent DC component variation or the like remains in the read signal. The DC component variation depending on the pattern is removed by use of a DFB (duty feedback) slicer, which utilizes the fact that the bit stream recorded on an optical disc is modulated by using a modulation code that, if integrated at given or more intervals, exhibits the appearance possibility of "0" becoming equal to the appearance possibility of "1." Since the DFB slicer is a technology well known in the art, detailed description thereof is not given.

Description will now be given with regard to a JFB (jitter feedback) DC compensator. When the DC component is zero and the PLL is completely locked, the phase error is zero, that is, the midpoint of the edge coincides with the zero level. When the read signal rather undergoes the DC variation with the PLL locked, the midpoint of the edge lies outside the zero level. Accordingly, the integration of the midpoint level of the edge can lead to a DC level. This method is employed provided that the PLL is locked, because the edge is used to detect the DC component.

PRML (partial response most-likely) decoding method involves decoding a read signal into a most-likely bit stream, while comparing the read signal at plural consecutive times with a target signal. Viterbi decoding method that is one of ML (most-likely) decoding methods is widely in practical use because of enabling a substantial reduction in the scale of the circuit. The PRML method has come into use also as a reading device for the optical disc in order to achieve higher speeds and larger capacities. Since the target signal is used provided that an unwanted DC component is completely absent, decoding performance undergoes deterioration if the DC component is superimposed on the read signal at the time of comparison of the read signal with the target signal.

When the device in a read mode, the device is made to minimize the occurrence of read error even if the disc is in bad condition such as situations where the disc is defective or soiled. For example, when the surface of the disc is so soiled that the read signal is almost entirely shielded, a defect detection technique such as described in Japanese Patent Application Publication Laid-open Application No. 2003-30850 can be used to minimize the influence of defects. It is well known in the art that the same or similar approach is used for the optical discs in general. In general outline, the approach involves a circuit that monitors the top envelope of the read signal and outputs a defect signal if the amplitude of the signal is equal to or less than a threshold for a given or longer time, as shown in FIG. 5. The approach involves, for the duration of output of the defect signal, holding the tracking, focusing and other controls and also holding the PLL of the read signal processing system and doing the like, thereby preventing undesirable operation resulting from the defects and hence minimizing the influence of the defects.

Besides local factors such as defects on the disc, a phenomenon occurs in which reading performance undergoes deterioration over an extremely wide range of the disc due to a disc's structure or the like, such as inter-layer interference of a dual layered disc. FIG. 6 shows an example of a read signal disturbed under the influence of the inter-layer interference. This is an instance where data is read from a layer-L1 of a rewritable dual layered Blu-ray Disc, that is, a layer close to the surface of the disc. As can be seen from FIG. 6, both the top and the bottom envelopes that should be, by nature, substantially flat undergo great disturbance under the influence of the inter-layer interference. During the reading of the data from the layer-L1, read light is focused on that layer. Part of the read light passes through the layer-L1 and reflected at layer-L0, and partially reaches a photodetector of an optical head. Since the light beams from the layer-L0 and the layer-L1 reach the photodetector simultaneously, the interference of the light beams occurs. Generally, a distance between the layer-L0 and the layer-L1 slightly varies according to their positions on the disc. When data is read from the disc under this condition, an interference pattern formed on the photodetector by the light beams from the layer-L0 and the layer-L1, changes with time. As a result, the read signal undergoes disturbance as shown in FIG. 6. When the disturbance is encountered in the signal as shown in FIG. 6, the signal recorded in the disturbed place cannot be accurately decoded and thus results in a burst error, as in the case of the defects. In the example shown in FIG. 6, the burst error is a few hundreds of bytes long. This length does not get in the way of reading in terms of the capability of an error correcting code of the Blu-ray Disc system. However, when data is read from a region where the distance between the layers varies greatly in the tangential direction of the disc, the state of the interference also changes more rapidly on the photodetector. Accordingly, the frequency of occurrence of disturbance of the signal as shown in FIG. 6 becomes higher, and thus the disturbance occurs plural times in one recording unit block (RUB). Under this condition, the probability of occurrence of the read error cannot be ignored. Incidentally, factors that cause the same or similar disturbance of the read signal include fingerprints and track deviation.

SUMMARY OF THE INVENTION

The read signal disturbed by the inter-layer interference of the dual layered disc or the like is characterized by involving local DC component variation. In this case, the read signal is characterized in that an interval of DC component variation is as short as a few tens of microseconds in time for BD1X. When the DC component is superimposed on the read signal as previously mentioned, the DC component causes deterioration in the performance of the PLL and the Viterbi decoder. Devices for removing the unwanted DC component from the read signal include the DFB slicer as previously mentioned. However, the DFB slicer requires a sufficiently long integrating time in order to eliminate statistical fluctuation, because of utilizing the appearance possibility of "0" equaling the appearance possibility of "1." In other words, the DFB slicer cannot handle the DC component variation caused by the inter-layer interference or the like.

The JFB DC compensator obtains the DC level by integrating the midpoint level of the edges, utilizing the fact that when the DC variation occurs in the read signal with the PLL locked, the midpoint of the edge lies outside the zero level, as described in Japanese Patent Application Laid-open Publication No. 2006-4465. This method requires the PLL to be locked because the edge is used for DC component detection. With the use of this method alone, DC component variation compensation is therefore difficult. Moreover, when the amplitude of the DC component superimposed on the read signal is very great, a problem arises as described below: two points adjacent to each other with the zero level in between are shifted from the position of a true edge, thus leading to an erroneous result. The DC component variation due to the inter-layer interference or the like of the dual layered disc which the present invention is intended particularly for is a phenomenon that occurs fast as compared to the operating speed of the DFB slicer as mentioned above, and moreover, its amplitude is as much as a few tens of percent of the amplitude of the read signal. Consequently, the method is likely to fall into a situation where a pseudo-edge is detected.

The Viterbi decoder can also handle the DC component variation in the read signal by causing a target signal level (or a target levels) of the Viterbi decoder to adaptively follow the read signal according to the level of the read signal. This technology is described in Japanese Patent Application Laid-open Publication No. Hei 11-296987. The technology must reduce the influence of short defects or the like that cannot be detected by a defect detecting mechanism, because the target levels for use in Viterbi decoding is allowed to follow the read signal. Accordingly, the length of integrating time of an integrator that determines the following speed of the targets must be such that the mechanism is not excessively sensitive to minute defects or the like. For this reason, an adaptive Viterbi decoder is also unsuitable for the handling of the local DC component variation such as the inter-layer interference.

An object of the present invention is to provide a read channel capable of reducing a local DC component variation such as inter-layer interference superimposed on a read signal, and thereby suppressing deterioration in performance of a PLL and a Viterbi decoder.

A read channel according to the present invention includes a means for detecting a local DC component. Moreover, the read channel determines the location of an edge of a read signal from a differential coefficient of the read signal, counts the number of edges occurring within a given interval, and calculates average DC amplitude using the number of edges. The read channel includes a means for preventing detection of a pseudo-edge at a long mark or space when determining the location of the edge from the differential coefficient of the read signal. Furthermore, the read channel includes a means for observing the state of a PLL, and controls the operation of a DC component detector according to the state of the PLL. Still furthermore, the read channel controls the operation of each element in the read channel according to the magnitude of DC component amplitude.

The present invention enables reducing deterioration in performance due to the local DC component variation in the read signal resulting from the inter-layer interference of the dual layered disc, fingerprints on the surface of the disc, or the like, thereby making it possible to provide an optical disc drive capable of reading with higher reliability.

DETAILED DESCRIPTION OF THE INVENTION

An embodiment of the present invention will be described below. The embodiment is intended for an optical disc drive. For the sake of simplicity, however, only parts which the present invention is intended directly for are shown and described, and other parts are omitted.

Figure 1:
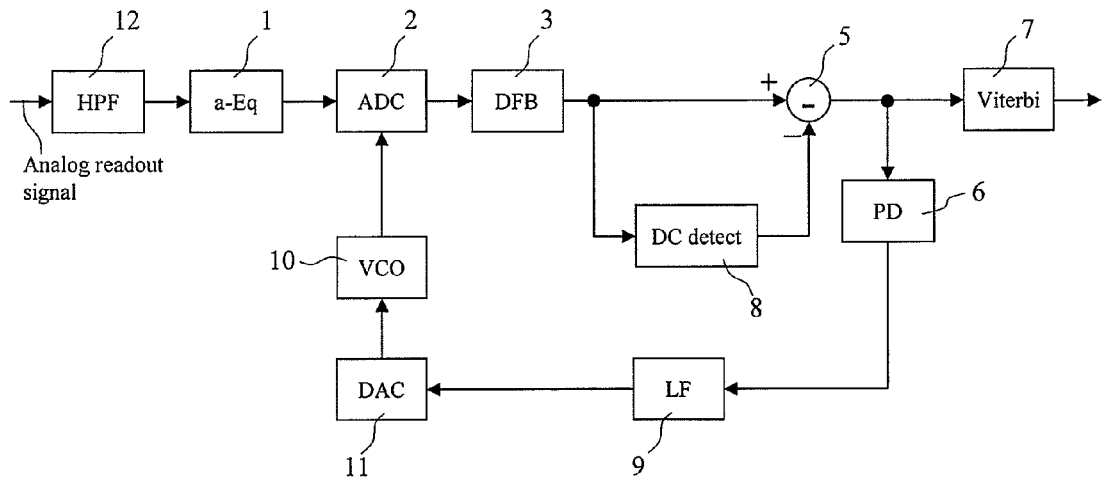
FIG. 1 is a diagram showing an example of the configuration of a read channel according to the present invention.
Figure 2:
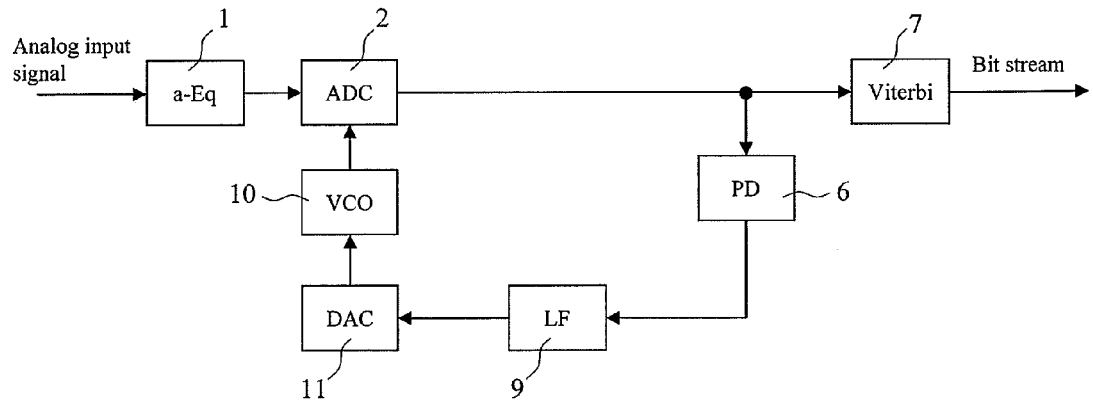
FIG. 2 is a diagram showing the configuration of the read channel.
Figure 3:
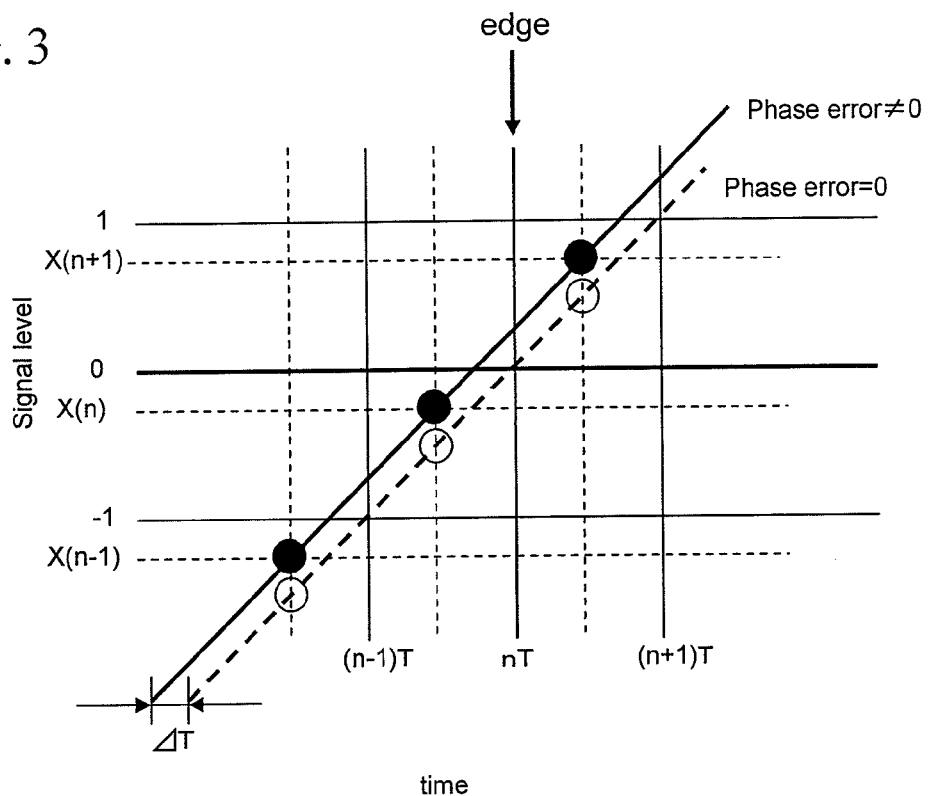
FIG. 3 is an illustration of assistance in explaining the principle of phase comparison.
Figure 4:
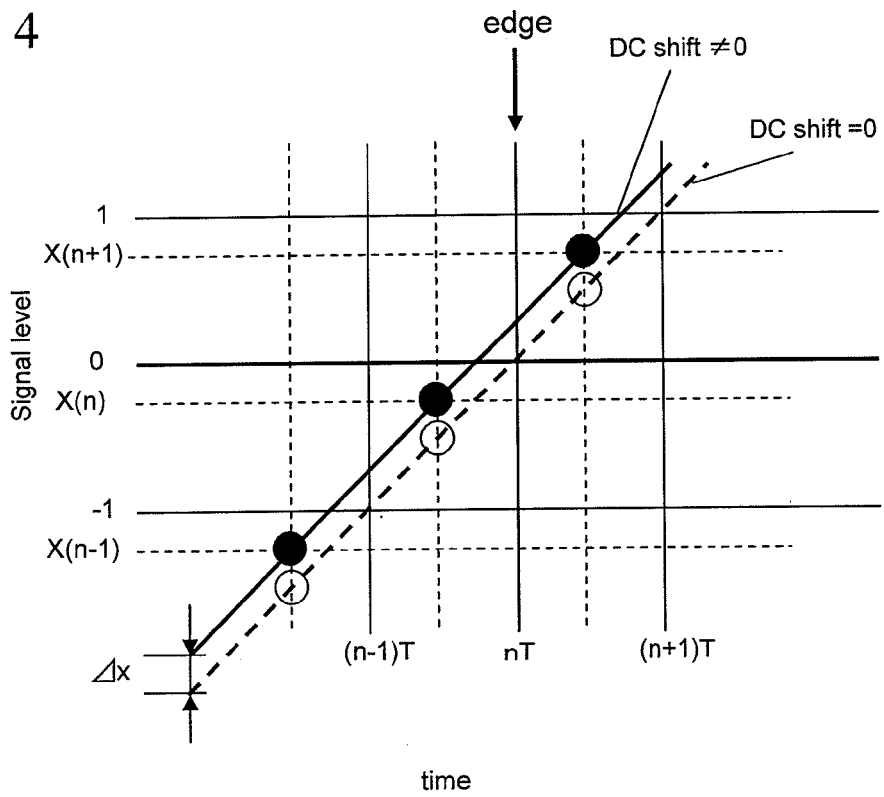
FIG. 4 is an illustration of assistance in explaining the influence of a DC component superimposed on a read signal upon the phase comparison.
Figure 5:
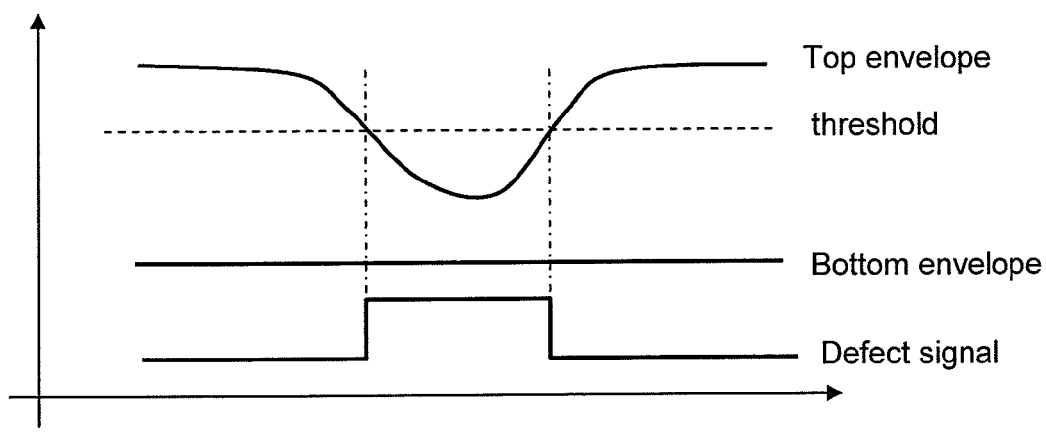
FIG. 5 is a graph of assistance in explaining the operation of a defect detector.
Figure 6:
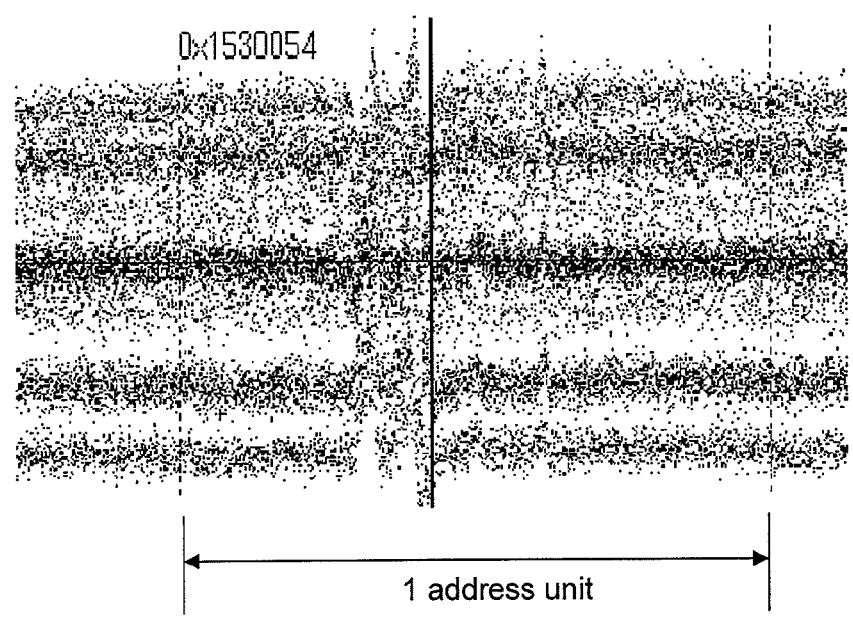
FIG. 6 is an illustration of a read signal affected by inter-layer interference.

FIG. 1 shows an embodiment of the present invention. FIG. 1 is a schematic block diagram of a read signal processing system of the optical disc drive which decodes an analog read signal into a bit stream. FIG. 1 is given provided that the present invention is applied to a BD.

An analog read signal outputted by a pickup is fed to a high-pass filter 12, which in turn removes almost all of DC components contained in the output from the pickup. After that, the analog read signal is subjected to waveform equalization by an analog equalizer 1 and is then converted into a digital signal by an AD converter 2. Here, sampling is done in synchronization with a channel clock. Then, a DFB slicer 3 removes DC component which varies depending on the influence of asymmetry and data pattern of the read signal. The output from the DFB slicer is inputted to a DC component detector 8. The DC component detector detects the amplitude of DC component remaining in the read signal. The configuration and operation of the DC component detector will be described later. The detected DC component is subtracted from the read signal by use of a subtracter 5. Thereby, a varying DC component is removed from the read signal before phase comparison and decoding, if the DC component detector operates at sufficiently high speed. After the DC component has been removed from the read signal, the read signal is inputted to a phase comparator 6, which in turn performs a phase comparison with a channel clock signal. An output from the phase comparator is inputted through a loop filter 9 to a DA converter 11. The DA converter converts the digital signal into an analog voltage signal. This signal is used as a frequency control signal for a VCO 10. The VCO oscillates at a frequency specified by the frequency control signal. After the DC component has been removed from the read signal, the read signal is inputted also to a Viterbi decoder 7, which in turn decodes the read signal into a bit stream.

Description will now be given with regard to the DC component detector. DC component detection takes place utilizing the following: when the DC component is zero and the PLL is locked, phase error is zero or equivalently the midpoints of the edges coincides with the zero level, whereas when a local DC variation occurs in the read signal with the PLL locked, the midpoint of the edge lies outside the zero level. The constant capability of detecting the edges is required because the edge is used for the DC component detection. Generally, the edges are distinguished by detecting that the values of two consecutive points of the read signal are in opposite sign. When the amplitude of the DC component superimposed on the read signal is large, however, a situation arises where the values of two points adjacent to each other with a true edge in between are in the same sign and the values of two points adjacent to each other with a false edge in between are of opposite sign. This is the very thing that has a great adverse influence on the phase comparison and Viterbi decoding.

Figure 7:
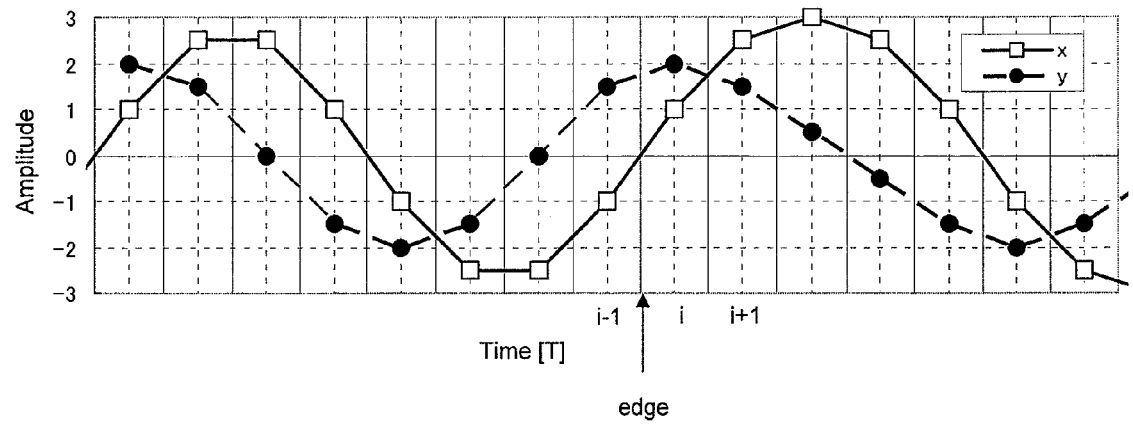
FIG. 7 is a plot of assistance in explaining the principle of detection of the amplitude of an instantaneous DC component.

In this embodiment, a differential edge discrimination method is therefore used in order to locate the true edge even in the above situation. This method utilizes the fact that a time differential coefficient of the read signal is a maximum or minimum at the edge. FIG. 7 is a plot of assistance in explaining the method. As previously mentioned, the read signal is expressed as x(n). Discrete time differential of x(n) is expressed as y(n) given by Equation (2). Hereinafter, a differential signal of the read signal refers simply to y(n) unless otherwise specified.

$$y(n)=x(n)-x(n-1) \qquad (2)$$

As shown for example in FIG. 7, y(i) is the maximum or minimum, assuming that the edge lies between x(i−1) and x(i). Even when the varying DC component is superimposed on the read signal, it is obviously possible to locate the true edge by time differential if the rate of change of the DC component relative to time is sufficiently slow as compared to the channel clock. An instantaneous value d(n) of the DC component at the edge is the mean value of the values of the two points adjacent to each other with the edge in between, as represented by Equation (3).

$$d(i)=\{x(i-1)+x(i)\}/2 \qquad (3)$$

It is necessary to compare the values of y(n−1), y(n) and y(n+1) at three consecutive times with one another in order to determine whether y(n) is the maximum or minimum.

Even if the edges are discriminated by using the differential edge discrimination and an instantaneous DC component value is obtained, it may possibly lead to a problem if it is simply subtracted from the read signal. In other words, the subtraction of the instantaneous value from the read signal is not proper, because the instantaneous value of the DC component takes a finite value even when a phase difference arises between the read signal and the channel clock. In the present embodiment, a moving average of instantaneous DC components is worked out and subtracted from the read signal in order to avoid the problem.

Figure 8:
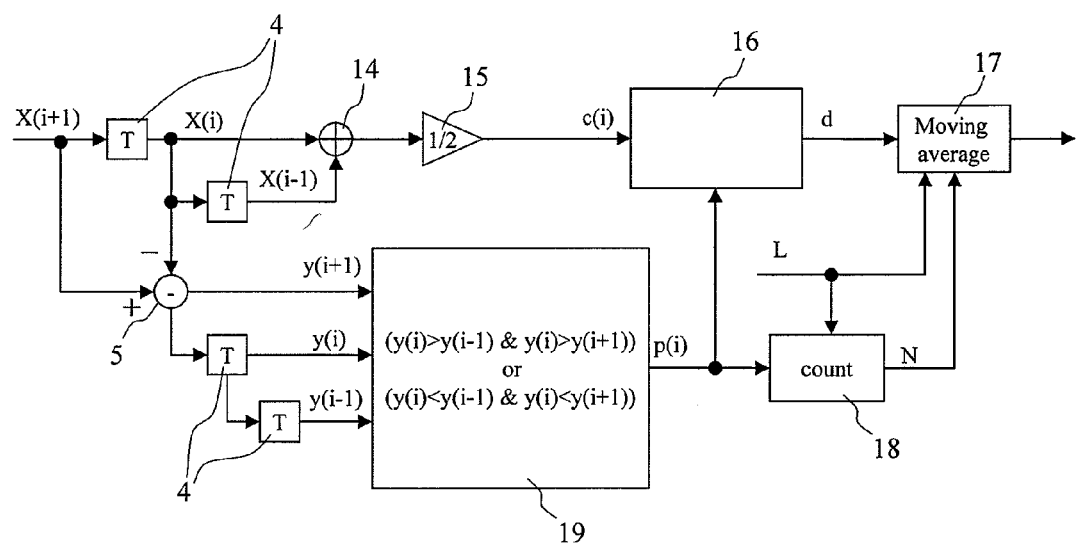
FIG. 8 is a diagram showing an example of the configuration of a DC component detector.

FIG. 8 shows the configuration of the DC component detector based on the above principle. Since a signal time in FIG. 8 indicates the instant of differential edge decision and instantaneous DC component detection at time i, an input to the DC component detector is expressed as x(i+1) allowing for required delay. The output from the DFB slicer is an input signal to the DC component detector. This signal is herein called merely "read signal." First, the read signal branches into two lines. The first line computes the amplitude of the DC component. In the first line, two 1 T delay circuits 4 are used to obtain x(i) and x(i−1), and an adder 14 and a multiplier 15 are used to find the mean value of x(i) and x(i−1) or equivalently obtain a candidate c(i) for the amplitude of the DC component. The term "candidate" is employed because the resulting value is not treated as the amplitude value unless judged as the true edge.

The second line dose the differential edge discrimination. First, the subtracter 5 is used to obtain the differential signal y(i+1) of the read signal from x(i+1) and x(i), which was used to compute the amplitude of the DC component. 1 T delay circuits 4 are used to obtain y(i) and y(i−1), based on y(i+1). y(i+1), y(i) and y(i−1) are inputted to a maximum/minimum detector 19, which in turn determines whether or not y(i) is the maximum or minimum. The result p(i) of determination is true if y(i) is the maximum or minimum. The result p(i) of determination, together with the candidate c(i) for the amplitude of the DC component, is inputted to a decider 16. If p(i) is true, the decider 16 outputs an instantaneous DC component d of the edge to a moving averager 17. A general moving average is not proper for the moving averager 17 to perform a moving average computation. The reason is that the edge appearance frequency is a fraction of the frequency of occurrence of the channel clock and the edges occur at irregular intervals. For this reason, a counter 18 counts the number of edges occurring within an average interval length specified by L, and the moving averager 17 divides the sum of the amplitudes of the instantaneous DC components at the edges within the interval by the number N of edges, thereby determining the average amplitude of the DC component.

When the phase difference arises between the read signal and the channel clock, the influence of the phase difference on the DC component detection on adjacent edges are opposite sign. Thus, taking the average as described above makes it possible to reduce the influence of the phase difference on the DC component detection, even when the phase difference arises between the read signal and the channel clock.

Longer average interval length L yields less susceptibility to noise or the like. However, if the average interval length L is too long, it produces the side effect of causing computing error due excess delay between the DC component and the output from the DFB slicer at the time of subtraction of the DC component from the output from the DFB slicer. An average interval length L of 100 to 1000 T is proper for handling the inter-layer interference in BD.

In FIG. 1, the result of subtraction of the DC component from the read signal is inputted as it is to the Viterbi decoder. Obviously, however, an adaptive equalizer may be inserted immediately before the Viterbi decoder to improve decoding performance.

Figure 9:
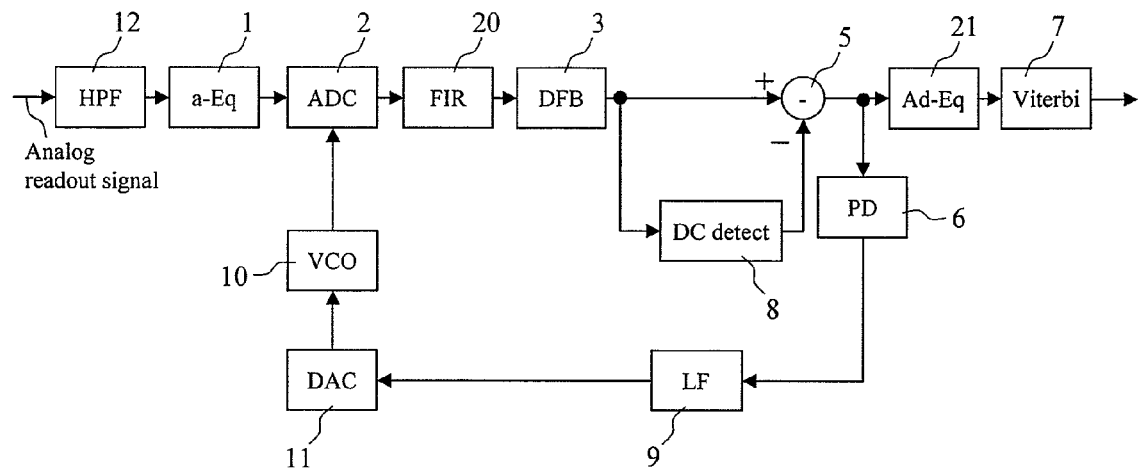
FIG. 9 is a diagram showing an example of the configuration of a read channel in which edge discrimination rate is improved by reducing inter symbol interference.
Figure 10:
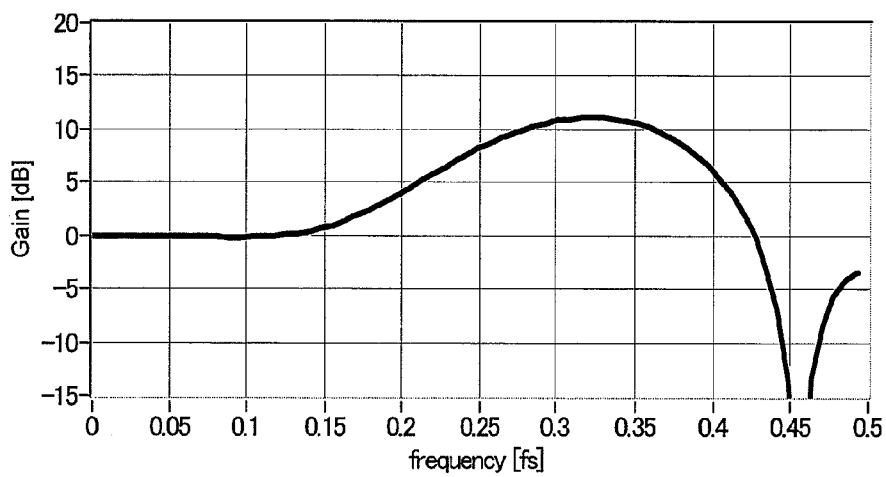
FIG. 10 is a graph showing the frequency characteristic of amplitude response of an equalizer for reducing the inter symbol interference.

In the BD, errors in differential edge discrimination is more likely to occur due to the influence of inter symbol interference in a place where a 2 T symbol that is a shortest symbol is adjacent to a 4 T or longer symbol. To reduce the likelihood of the differential edge decision error, it should be equalized prior to the differential edge decision so as to reduce the inter symbol interference. FIG. 9 shows a configuration in which this equalization is implemented. An FIR (finite impulse response) equalizer 20 is inserted immediately before the DFB slicer to perform equalization so as to reduce the inter symbol interference. FIG. 10 shows the equalization characteristics of the FIR equalizer. In this instance, moreover, an adaptive equalizer 21 is inserted immediately before the Viterbi decoder 7 to enhance the decoding performance.

Figure 11:
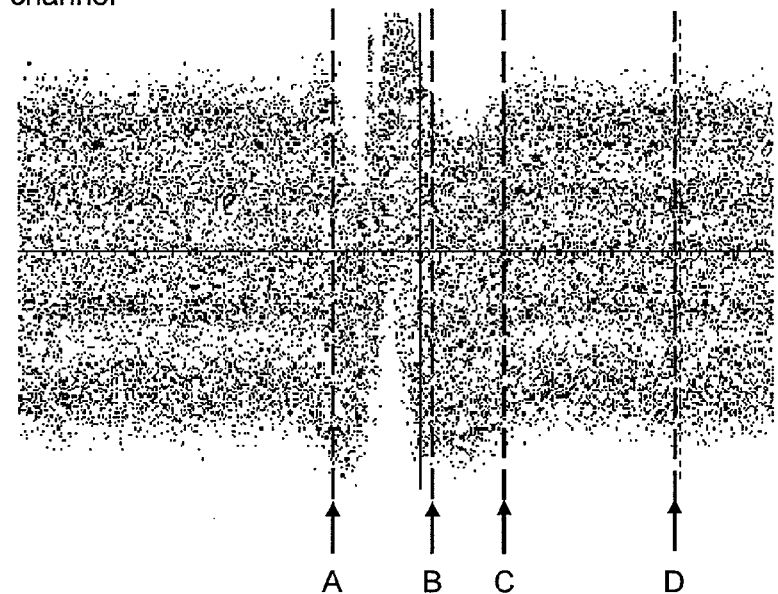
FIGS. 11A and 11B are illustrations of assistance in explaining the effect of the present invention.
Figure 11:
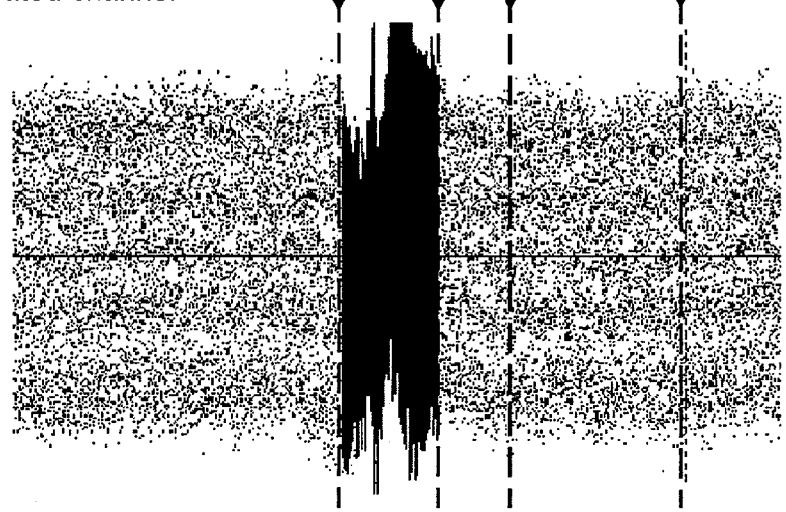

FIGS. 11A and 11B are illustrations of assistance in explaining the effect of the configuration shown in FIG. 9. A BD dual layered disc having a surface recording capacity of 25 gigabytes was used. FIGS. 11A and 11B each show a read signal wave processed by a signal processing simulator, the read signal wave being read from the disc in a place where the influence of inter-layer interference manifests itself. The read signal wave shown in FIG. 11A is the result obtained by a conventional channel, and the read signal is disturbed between the vicinity of time A and the vicinity of time D. Specifically, in an interval between the times A and B, the amplitude decreases sharply, and subsequently a large positive DC component is superimposed on the signal, and thus, in some period, a top envelope lies beyond a processing range. In an interval between the time B and the vicinity of time C, a negative DC component is superimposed on the signal, and its amplitude is as much as about 20% of the amplitude of the read signal. In an interval between the vicinity of the time C and the vicinity of the time D, another positive DC component, although small, is superimposed on the signal. The signal wave shown in FIG. 11B is that processed by a system shown in FIG. 9. Incidentally, both the signal waves shown in FIGS. 11A and 11B are those immediately before entering the adaptive equalizer. The signal processing simulator has the function of decoding an error correcting code and displaying an error location. Since a continuous line is used to display the error location, a burst error location is displayed as solidly shaded, as shown in the interval between the times A and B in FIG. 11B. An error is not displayed in FIG. 11A, because the inter-layer interference had a significant influence, thus caused a read error, and thus made it impossible to acquire error location information that should have been obtained through error correction.

As is apparent from comparison of the intervals between the times B and C shown in FIGS. 11A and 11B, the negative DC component is substantially eliminated from the signal wave of FIG. 11B although it is observed in the signal wave of FIG. 11A, and moreover, no error occurs in the signal wave of FIG. 11B. The same goes for the interval between the times C and D. As for the interval between the times A and B, the effect of improvement is not achieved because of the decrease in the amplitude and the superimposed DC component was beyond the processing range.

Figure 12:
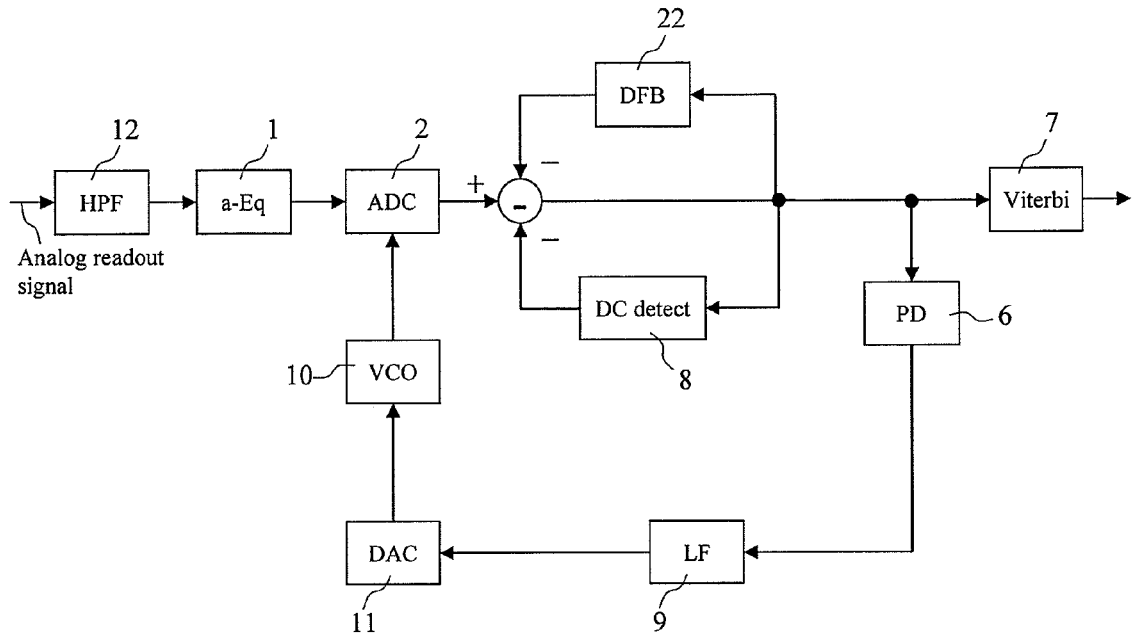
FIG. 12 is a diagram showing a configuration in which a feedback method is used for DC component compensation.

It is also possible to achieve the same effect with a configuration in which a feedback method is used to subtract the detected DC component from the read signal. In an example shown in FIG. 12, a feedback loop is configured in parallel with a loop of the DFB slicer in order to subtract outputs from the DC component detector 8 and a DFB circuit 22 from an output from the AD converter 2. As employed herein, the DFB circuit refers to every circuit element that constitutes the DFB slicer, except for the adder (or the subtracter).

Figure 13:
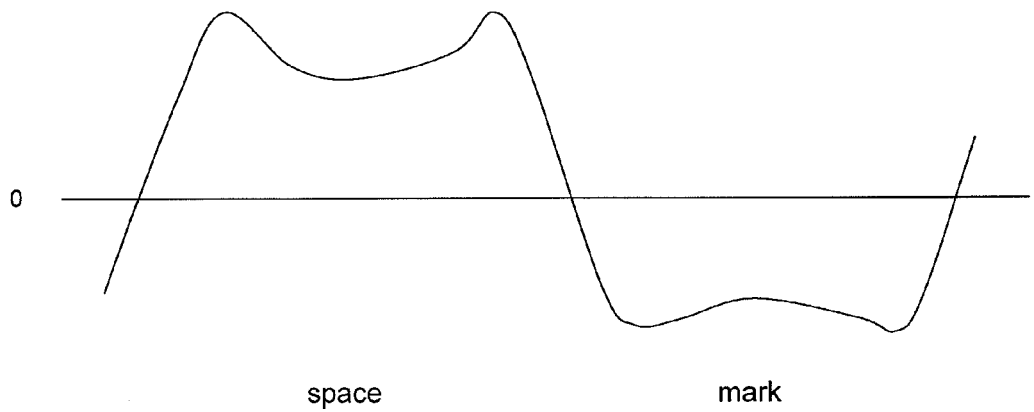
FIG. 13 is a representation showing an example of wave distortion at the centers of a long mark and space.
Figure 14:
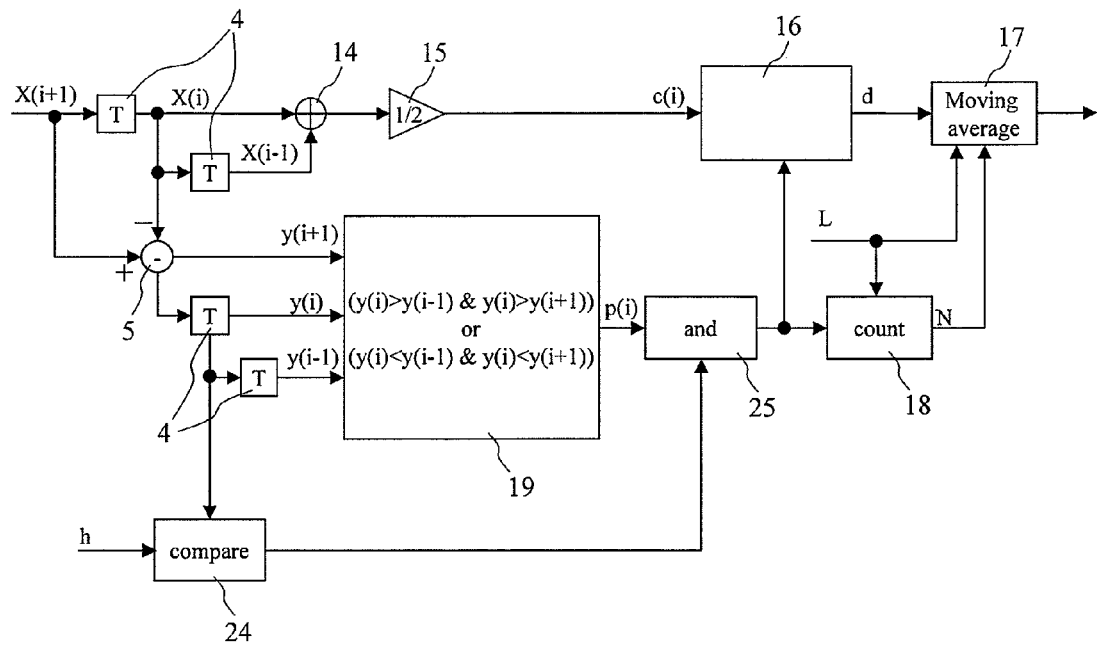
FIG. 14 is a diagram showing an example of the configuration of a DC component detector designed to avoid erroneous edge determination in the long mark or space.

A long space or mark in the read signal can possibly be concave or convex at its center, as shown in FIG. 13. This concavity or convexity can possibly appear according to the shape of the mark on the disc or the conditions of equalization. The presence of the concavity or convexity can possibly lead to erroneous edge discriminations, because the differential signal of the read signal exhibit a maximum or minimum in the vicinity of the center of the mark or space. However, the absolute value of the differential coefficient is small because the concavity or the like is gentle in form. The maximum and minimum having a small absolute value can be therefore ignored to avoid the erroneous edge discriminations. FIG. 14 shows the configuration of the DC component detector in which this function is implemented.

Its configuration is that the above function is added to the DC component detector shown in FIG. 8. Specifically, the maximum and minimum values to be off target for the edge determination are predetermined, and an absolute value h thereof is placed in an absolute value comparator 24. The differential y(i) of the read signal at a point targeted for the edge determination is fed to the other input of the absolute value comparator 24. An output from the absolute value comparator 24 is a logical signal, and the absolute value comparator 24 makes a comparison between the absolute values and outputs "true" if y(i) is more than h. This output is inputted to one terminal of an AND circuit 25. An output from the maximum/minimum detector 19 is inputted to the other terminal of the AND circuit 25. An output from the AND circuit 25 is the result of the edge determination. Other operations are the same as shown for example in FIG. 8.

The PLL is required to be in a locked state for detecting the DC component. It is therefore necessary to automatically control the operation of the DC component detector according to the state of the PLL. A situation such that the amplitude of the varying DC component superimposed on the read signal is significantly large, thus the DC component cannot be fully compensated, as shown for example in FIGS. 11A and 11B, can also possibly arise In such a situation, the operation of each element of a read channel can be temporarily held to reduce deterioration in performance.

Figure 15:
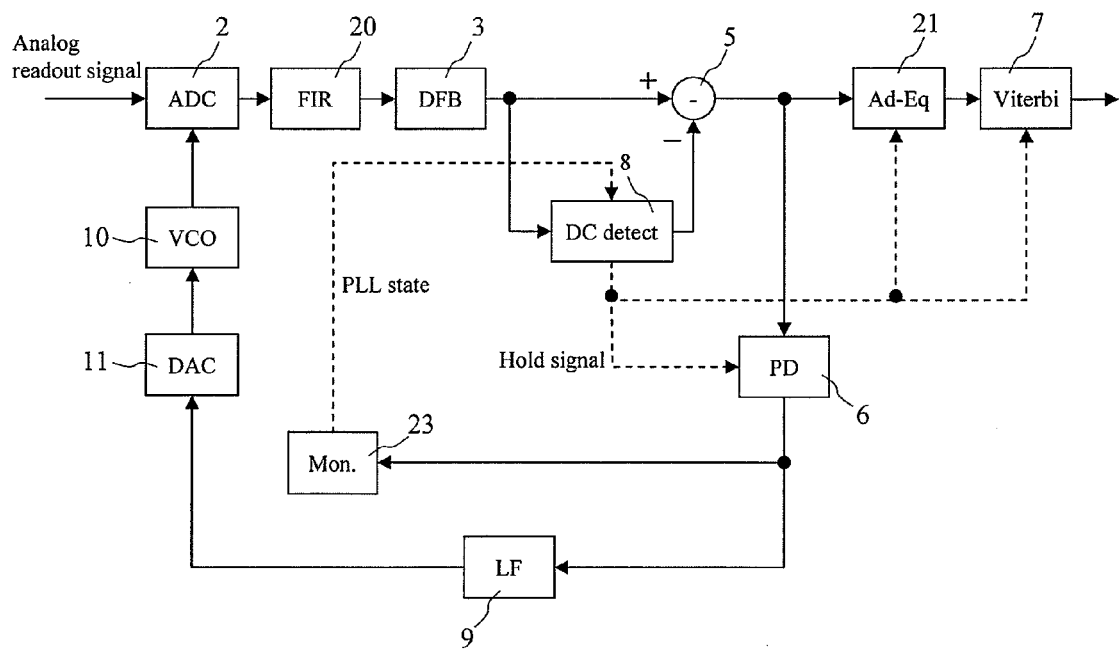
FIG. 15 is a diagram showing an example of a configuration with the addition of a hold function under given conditions.

FIG. 15 shows a configuration with the addition of the function of automatically controlling the operation of the DC component detector according to the state of the PLL, and also holding the operation of some elements of the read channel during detection of the DC component above a specified level. Although the configuration shown in FIG. 15 is based on the configuration shown in FIG. 9, the subject matter of this embodiment may be likewise applied to the configurations shown in FIGS. 1 and 12.

The state of the PLL is monitored by a PLL lock monitor 23. Since circuit for observing the state of the PLL is well known in the art, detailed description is not given herein with regard to the configuration and operation thereof. The PLL lock monitor determines whether or not the PLL is locked, and the DC component detector 8 operates under control of an output from the PLL lock monitor. Specifically, if the PLL is in its locked state, the operation for DC component detection is enabled to compensate the DC component of the read signal, or if the PLL is not locked, the operation for DC component detection is held so that an output from the DC component detector 8 becomes zero.

If the DC component detector 8 detects the DC component above the predetermined specified level, the DC component detector 8 outputs a hold signal while the value of the DC component exceeds the specified level. The hold signal is inputted to the following elements: the phase comparator 6, the adaptive equalizer 21 and the Viterbi decoder 7. While receiving the hold signal, the phase comparator 6 produces outputs, all of which are zeros. Thereby, the oscillation frequency of the VCO 10 is fixed during that time. This enables avoiding an erroneous phase comparison resulting from inadequate compensation due to extreme DC components.

While receiving the hold signal, the adaptive equalizer 21 holds its adaptive operation and maintains the tap coefficients immediately before receiving the hold signal. This enables preventing abnormal coefficient learning. In this instance, the Viterbi decoder 7 uses an adaptive Viterbi method, and thus, while receiving the hold signal, the Viterbi decoder 7 also holds its adaptive operation in order to prevent abnormal target learning, as in the case of the adaptive equalizer.

Figure 16:
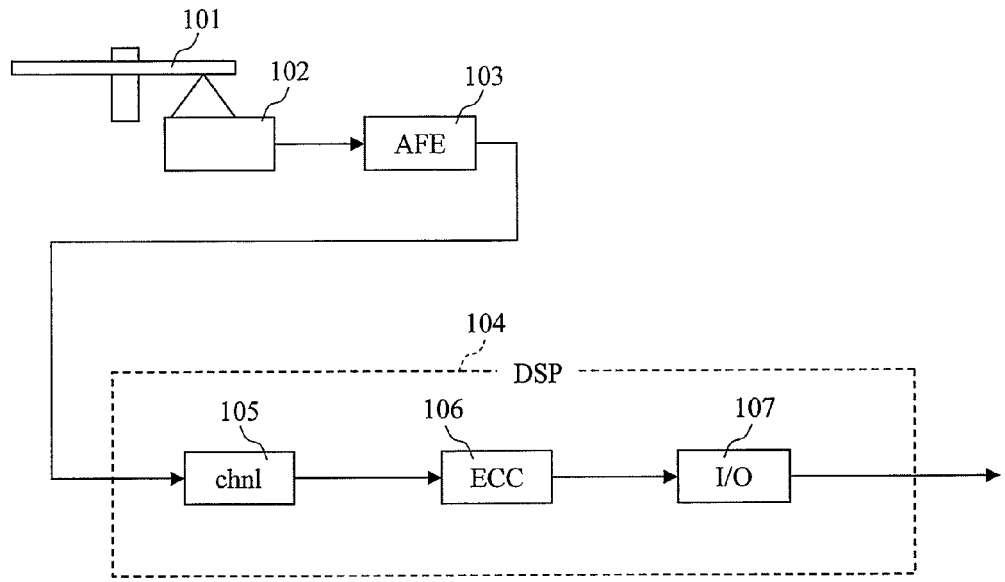
FIG. 16 is a diagram of the configuration of an optical disc drive using the read channel according to the present invention.

FIG. 16 shows, in schematic form, the configuration of an optical disc drive implemented according to the present invention. Only parts requiring description in connection with the present invention are shown in FIG. 16, and other parts are omitted therefrom. Also as for details of parts, description of parts that can be readily understood by those skilled in the art is omitted.

Figure 17:
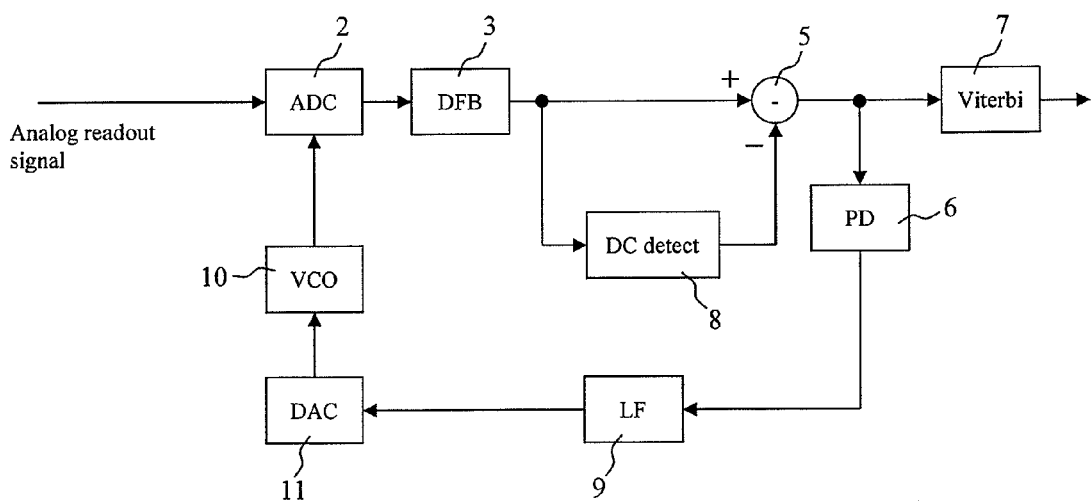
FIG. 17 is a diagram of the configuration of a read channel digital unit.

Firstly, the operation of the optical disc drive will be described in outline. Information recorded on an optical disc 101 is optically read out and converted into an electric signal (or a read signal) by a pickup 102. The read signal is amplified by an AFE-IC (analog front end integrated circuit) 103 to reach given amplitude and is equalized by a built-in analog equalizer within the AFE-IC, and then the read signal is inputted to a read channel digital unit 105 in a DSP (digital signal processor) 104. As described with reference to the above embodiment, the read signal is decoded into a bit stream by the read channel digital unit. In the present embodiment, the optical disc drive is configured using two types of LSI (large-scale integrated) circuits: the AFE-IC including integration of almost all analog circuits of the optical disc drive and the DSP including integration of almost all digital circuits thereof. The configuration using a combination of the LSI circuits in this manner is generally used for the optical disc drive, and in this case, the analog equalizer is typically integrated in the AFE-IC. As employed herein, the read channel digital unit refers to a section of the read channel shown in FIG. 1, following after the AD converter and formed mainly of digital circuits, as shown in FIG. 17.

The resultant bit stream is subjected to error correction by an ECC (error correction code) decoder 106 to yield user data. The resultant user data goes out of the drive through an interface circuit 107. The use of the read channel capable of handling a local DC component variation occurring in the read signal brings about an improvement in reading performance of the dual layered disc or the disc having fingerprints thereon.

Figure 18:
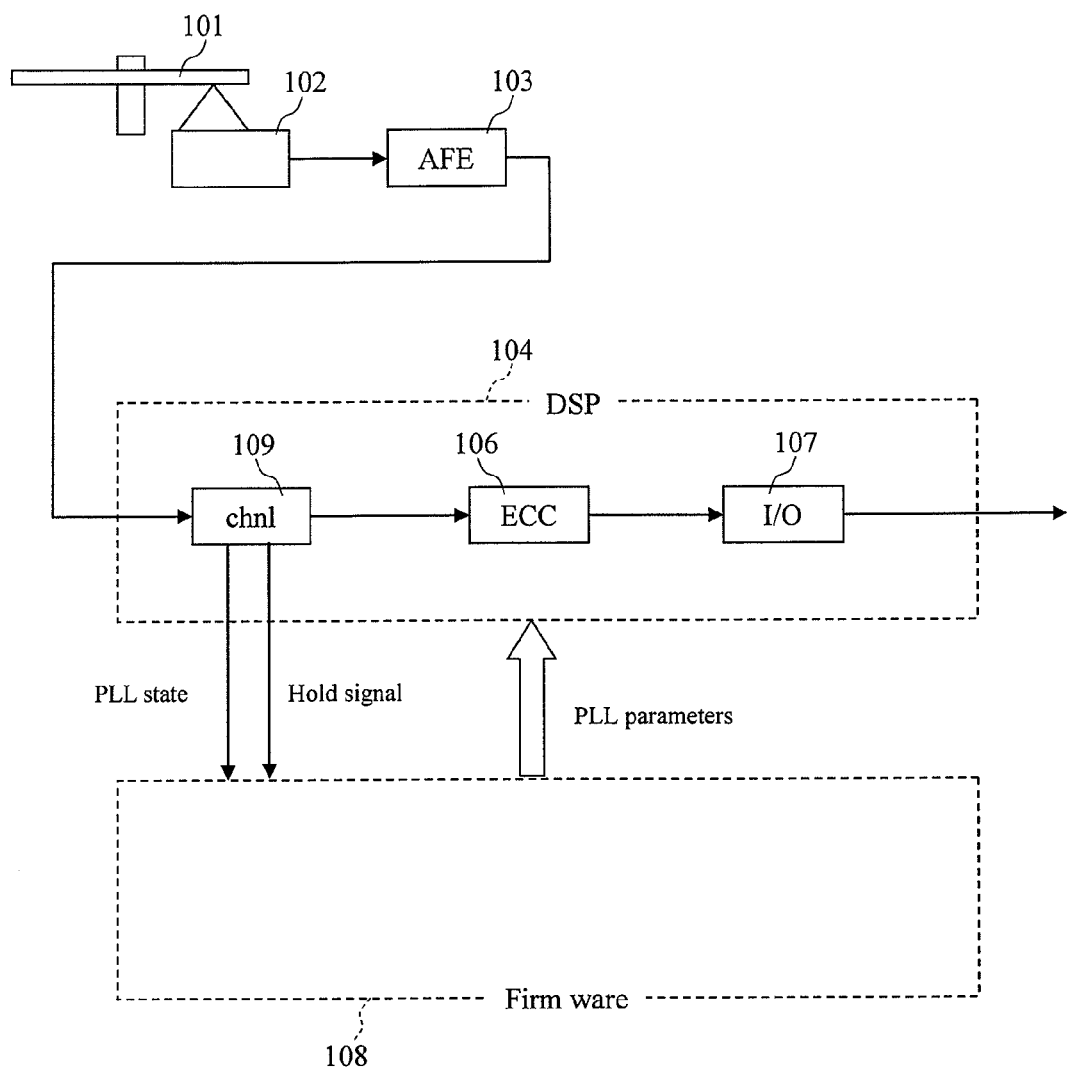
FIG. 18 is a diagram of the configuration of an optical disc drive using the read channel according to the present invention.

FIG. 18 is a schematic illustration of the configuration of an optical disc drive using the read channel of a type shown in FIG. 15. The operation of the optical disc drive will be described in outline. Information recorded on the optical disc 101 is optically read out and converted into an electric signal (or a read signal) by the pickup 102. The read signal is amplified by the AFE-IC 103 to reach given amplitude and is equalized by the analog equalizer contained within the AFE-IC, and then the read signal is inputted to a monitor-equipped read channel digital unit 109 in the DSP 104. As described with reference to the above embodiment, the read signal is decoded into a bit stream by the monitor-equipped read channel digital unit. As employed herein, the monitor-equipped read channel digital unit refers to a section of the read channel shown in FIG. 1, following after the AD converter and formed mainly of digital circuits, as shown in FIG. 15.

The resultant bit stream is subjected to error correction by the ECC decoder 106 to yield user data. The resultant user data goes out of the drive through the interface circuit 107.

The read channel, as used in this example, is characterized by being provided with two types of signals: the signal indicative of the state of the PLL; and the hold signal which the DC component detector outputs while detecting the DC component of given or greater amplitude, as described for FIG. 15. Under normal conditions, these signals are used to control the operation of each element in the read channel, as previously mentioned. In the example, the signals can be referred to by firmware 108. Thereby, the firmware 108 can be informed of the occurrence of trouble during reading. In the example, if a read error occurs while a block of data is read, the PLL state signal is monitored to see whether or not the PLL has fallen into its unlocked state while the block of data is read. If the PLL is in its unlocked state, the firmware 108 tries avoiding the unlocked state by placing PLL parameters in the DSP so as to temporarily increase or decrease a time constant of the PLL.

The instantaneous value of the DC component which the DC component detector obtains using the differential edge discrimination, as shown in FIG. 8, has an error due to the influence of noise present in the read signal. The instantaneous value of the DC component can also possibly be the erroneous value due to the erroneous edge determination under the influence of the inter symbol interference. To reduce these influences, the DC component detector determines an average DC component, using the moving average or integral of the instantaneous value of the DC component determined by the differential edge discrimination. The average DC component determined in this manner, of course, lags behind the read signal. To enhance the effect of averaging, it is necessary to lengthen an interval targeted for averaging.

Clearly, a large amount of delay, however, affects the subtraction of the determined DC component from the read signal, which is therefore unlikely to achieve its full effect.

Figure 19:
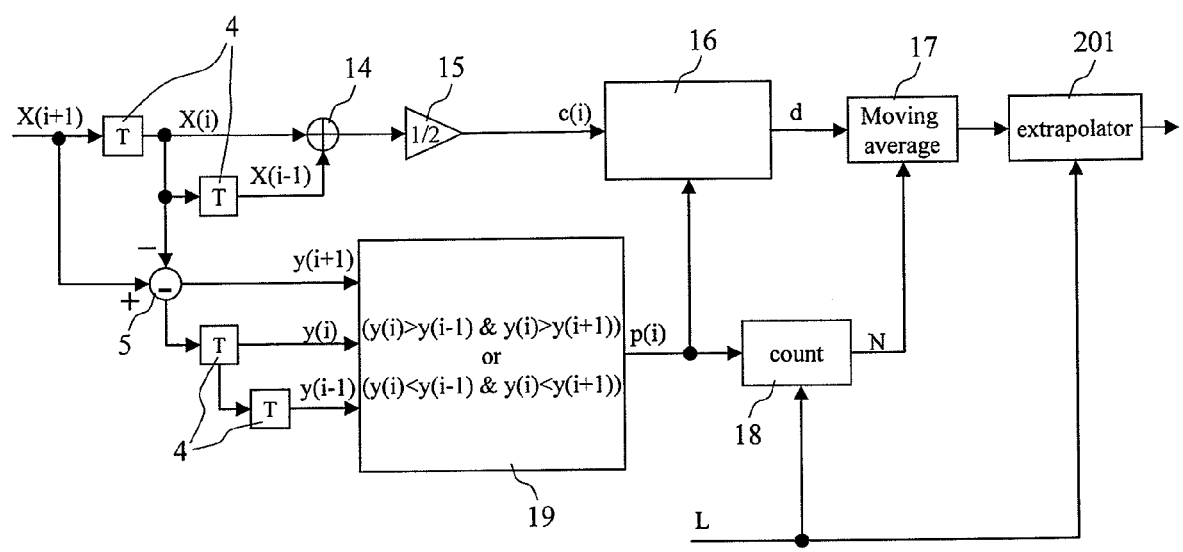
FIG. 19 is a diagram showing an example of the configuration of a DC component detector in which an extrapolator is used to eliminate delay in DC component detection.

FIG. 19 shows, in schematic form, the configuration of a DC component detector capable of avoiding the above problem. The configuration leading to an average DC component value is the same as shown in FIG. 8. The configuration shown in FIG. 19 is different from that shown in FIG. 8 in that an output from the moving averager is further inputted to an extrapolator 201 so that a final output from the DC component detector is an output from the extrapolator. The extrapolator estimates a value at a time after the latest input time by extrapolation based on past values. Since the extrapolator is widely used for a signal processing circuit, detailed description is not given herein with regard to the configuration thereof and so on. In the present case, the delay between the average DC component and the read signal as mentioned above can be substantially eliminated by determining a value at a time after averaging time L, because the main cause of delay is averaging.

The present invention relates to a read channel mainly for use in an optical disc drive. The present invention is effective particularly for a drive for BD and HDDVD media having two or more recording layers. The present invention may be applied to a perpendicular magnetic recording hard disc drive or the like including a channel for reading out a signal having the same or similar problems, besides the optical disc drive.

What is claimed is:

1. A read signal processing circuit, comprising:
   an AD converter that converts an analog read signal into a digital read signal;
   a DFB slicer that processes the digital read signal;
   a DC component detector that detects a DC component remaining in an output from the DFB slicer;
   a subtracter that subtracts an output from the DC component detector from the output from the DFB slicer;
   a phase comparator that performs a comparison between a phase of an output from the subtracter and a phase of a channel clock signal;
   a loop filter to which an output from the phase comparator is inputted;
   a DA converter that converts an output from the loop filter into an analog voltage signal;
   a VCO that oscillates at a frequency specified by the analog voltage signal supplied from the DA converter and thereby generates the channel clock signal; and
   a Viterbi decoder to which an output from the subtracter is inputted.

2. The read signal processing circuit according to claim 1, wherein
   the DC component detector includes:
   a means for determining a differential signal of the read signal by a time difference of the read signal;
   a means for determining a maximum or minimum time of the differential signal;
   a means for determining an instantaneous value of the digital read signal at an edge of the digital read signal determined according to the maximum or minimum time of the differential signal; and
   a means for determining an average DC component value by determining the average of the instantaneous values of the digital read signal at the edge of the digital read signal, and
   the DC component detector outputs the average DC component value.

3. The read signal processing circuit according to claim 1, wherein the DC component detector includes:
a means for determining a differential signal of the read signal by a time difference of the read signal;
a means for determining a maximum or minimum time of the differential signal;
a means for determining an instantaneous value of the digital read signal at an edge of the digital read signal determined according to the maximum or minimum time of the differential signal;
a means for counting the number of occurrences of the maximum or minimum of the differential signal within a specified time; and
a means for determining an average DC component value from the sum of the instantaneous values of the digital read signal at the edge of the digital read signal within the specified time and the number of occurrences of the maximum or minimum, and
the DC component detector outputs the average DC component value.

4. The read signal processing circuit according to claim 1, further comprising:
an absolute value comparator,
wherein the maximum or minimum of the differential signal having a smaller absolute value than a preset absolute value in the absolute value comparator is ignored.

5. The read signal processing circuit according to claim 1, wherein the output from the DC component detector is negatively fed back into an output from the AD converter.

6. The read signal processing circuit according to claim 1, wherein an FIR equalizer is interposed between the AD converter and the DFB slicer.

7. The read signal processing circuit according to claim 1, further comprising:
a PLL lock monitor;
a means for controlling operation of the DC component detector under an output from the PLL lock monitor; and
a means for controlling operation of each element in the read signal processing circuit according to the DC component value detected by the DC component detector.

8. The read signal processing circuit according to claim 1, wherein an output from the determining means the average DC component value is inputted to an extrapolator, and an output from the extrapolator is subtracted from the read signal by use of the subtracter.

9. A read signal processing method, comprising the steps of:
converting an analog read signal into a digital read signal;
processing the digital read signal by a DFB slicer;
detecting a DC component remaining in an output from the DFB slicer;
subtracting the DC component from the output from the DFB slicer;
making a comparison between a phase of the subtracted signal and a phase of a channel clock signal;
generating the channel clock signal in response to the result of the phase comparison; and
decoding the subtracted signal,
wherein the step of detecting the DC component includes determining the DC component by determining the average of instantaneous values of the digital read signal at an edge of the digital read signal, the edge being determined according to a time at which a differential signal of the digital read signal becomes a maximum or minimum.

10. The read signal processing method according to claim 9, wherein the maximum or minimum of the differential signal having a smaller absolute value than a preset absolute value is ignored.

11. The read signal processing method according to claim 9, wherein the state of a PLL is monitored, and if the PLL is not locked, the DC component is set to zero.

12. The read signal processing method according to claim 9, wherein when the detected DC component exceeds a predetermined value, a phase difference between the subtracted signal and the channel clock signal is set to zero so that learning is not done at the step of decoding.

13. An optical disc drive including: a pickup that optically reads out information recorded on an optical disc and converts the information into a read signal; and a read signal processing circuit that processes the read signal, wherein
the read signal processing circuit includes:
a digital PLL configured of an AD converter, a DFB slicer, a phase comparator, a loop filter, a DA converter, and a VCO;
a DC component detector that detects a DC component remaining in an output from the DFB slicer;
a means for subtracting an output from the DC component detector from the output from the DFB slicer; and
a Viterbi decoder to which an output from the subtracting means is inputted, and
the DC component detector includes:
a means for determining a differential signal of the read signal by a time difference of the read signal;
a means for determining a maximum or minimum time of the differential signal;
a means for determining an instantaneous value of the read signal at an edge of the read signal determined according to the maximum or minimum time of the differential signal; and
a means for determining an average DC component value of the instantaneous value of the read signal at the edge of the read signal.

14. The optical disc drive according to claim 13,
wherein the DC component detector counts the number of occurrences of the maximum or minimum of the differential signal within a specified time, and
the DC component determines the average DC component value from the instantaneous value of the read signal at the edge of the read signal within the specified time and the number of occurrences of the maximum or minimum of the differential signal.

15. The optical disc drive according to claim 13, comprising an absolute value comparator, wherein the maximum or minimum of the differential signal having a smaller absolute value than a preset absolute value in the absolute value comparator is ignored.

16. The optical disc drive according to claim 13,
wherein the read signal processing circuit includes:
a PLL lock monitor;
a means for controlling operation of the DC component detector under an output from the PLL lock monitor; and
a means for controlling operation of each element in the read signal processing circuit according to the DC component value detected by the DC component detector.

* * * * *